(12) United States Patent
Engelhart et al.

(10) Patent No.: US 8,933,525 B2
(45) Date of Patent: Jan. 13, 2015

(54) SEMICONDUCTOR APPARATUS AND METHOD OF FABRICATION FOR A SEMICONDUCTOR APPARATUS

(75) Inventors: Peter Engelhart, Leipzig (DE); Robert Seguin, Berlin (DE); Wilhelmus Mathijs Marie Kessels, Tilburg (NL); Gijs Dingemans, Tilburg (NL)

(73) Assignee: Q-Cells SE, Bitterfeld-Wolfen, OT Thalheim ( * ) Notice: Subject to any disclaimer, the term of this patent is extended or adjusted under 35 U.S.C. 154(b) by 0 days.

(21) Appl. No.: 13/378,246

(22) PCT Filed: May 31, 2010

(86) PCT No.: PCT/DE2010/075045
§ 371 (c)(1),
(2), (4) Date: Dec. 14, 2011

(87) PCT Pub. No.: WO2010/145648
PCT Pub. Date: Dec. 23, 2010

(65) Prior Publication Data
US 2012/0091566 A1    Apr. 19, 2012

(30) Foreign Application Priority Data
Jun. 16, 2009   (DE) .................. 10 2009 025 977

(51) Int. Cl.
*H01L 31/0232*    (2014.01)
*H01L 23/58*      (2006.01)
(Continued)

(52) U.S. Cl.
CPC ...... *H01L 31/02167* (2013.01); *H01L 31/1868* (2013.01); *Y02E 10/50* (2013.01)

USPC .............. 257/436; 257/629; 257/635; 438/72

(58) Field of Classification Search
USPC .................. 438/72; 257/436, 437, 629, 635
See application file for complete search history.

(56) References Cited

U.S. PATENT DOCUMENTS 4,086,614 A * 4/1978 Scheidel .................... 257/645
4,446,194 A * 5/1984 Candelaria et al. ......... 428/428
(Continued)

FOREIGN PATENT DOCUMENTS

DE    102007054384 A1    5/2009
EP         1635398 A2     3/2006
(Continued)

OTHER PUBLICATIONS

Hoex B. et al., "On the c-Si Surface Passivation Mechanism by the Negative-Charge-Dielectric Al2O3", Journal of Applied Physics, vol. 104, No. 11, Jan. 12, 2008.

(Continued)

*Primary Examiner* — Karen Kusumakar
(74) *Attorney, Agent, or Firm* — Heslin Rothenberg Farley & Mesiti P.C.; Victor A. Cardona, Esq.

(57) ABSTRACT

The invention relates to a semiconductor apparatus and a method of fabrication for a semiconductor apparatus, whereby the semiconductor apparatus includes a semiconductor layer and a passivation layer arranged on a surface of the semiconductor layer and serving for passivating the semiconductor layer surface, whereby the passivation layer comprises a chemically passivating passivation sublayer and a field-effect-passivating passivation sublayer, which are arranged one above the other on the semiconductor layer surface.

18 Claims, 2 Drawing Sheets

Figure 1:
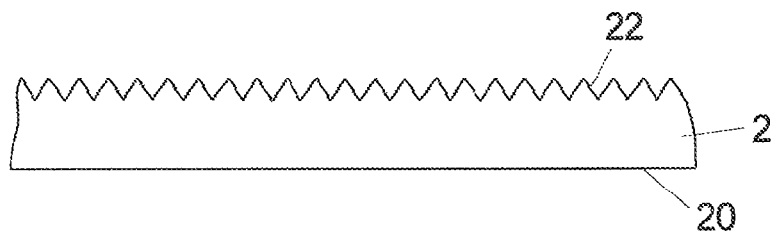
Figure 1:
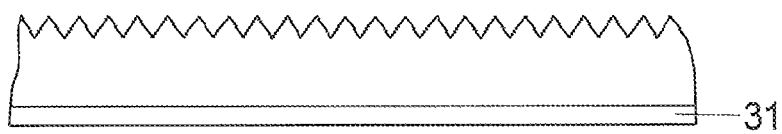
Figure 1:
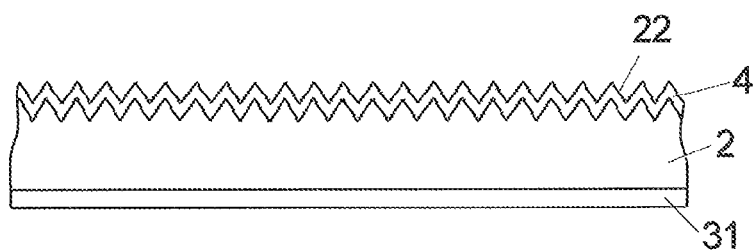
Figure 1:
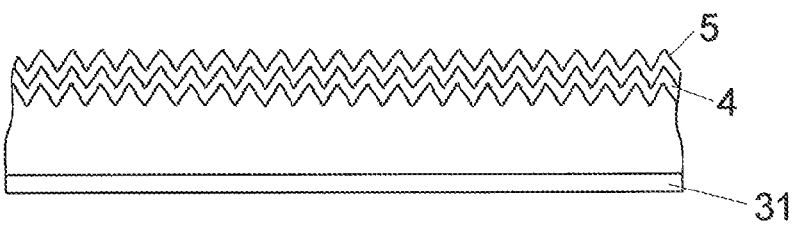
Figure 1:
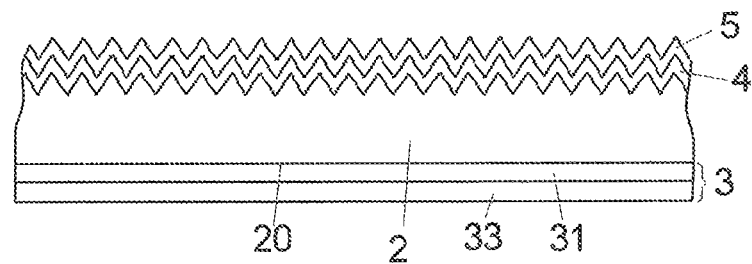

(51) Int. Cl.
*H01L 21/00* (2006.01)
*H01L 31/0216* (2014.01)
*H01L 31/18* (2006.01)

(56) References Cited

U.S. PATENT DOCUMENTS

| | | | |
|---|---|---|---|
| 4,804,640 A * | 2/1989 | Kaganowicz et al. | 438/762 |
| 5,589,008 A | 12/1996 | Keppner | |
| 2005/0011548 A1 | 1/2005 | Nagashima et al. | |
| 2006/0054937 A1 * | 3/2006 | Lucovsky et al. | 257/213 |
| 2006/0255340 A1 * | 11/2006 | Manivannan et al. | 257/79 |
| 2007/0148336 A1 * | 6/2007 | Bachrach et al. | 427/97.1 |
| 2007/0175508 A1 * | 8/2007 | Park | 136/256 |
| 2009/0007962 A1 * | 1/2009 | Wenham et al. | 136/256 |
| 2009/0056797 A1 * | 3/2009 | Barnett et al. | 136/255 |
| 2009/0283141 A1 * | 11/2009 | Bentzen et al. | 136/256 |
| 2010/0032012 A1 | 2/2010 | Isaka et al. | |
| 2010/0084009 A1 | 4/2010 | Carlson et al. | |
| 2010/0263725 A1 | 10/2010 | Schmidt | |

FOREIGN PATENT DOCUMENTS

| | | |
|---|---|---|
| JP | 04-296063 | 10/1992 |
| JP | 10-229211 | 8/1998 |
| JP | 10229211 | 8/1998 |
| JP | 2002-277605 | 9/2002 |
| JP | 2006-019549 | 1/2005 |
| JP | 2006-073617 | 3/2006 |
| JP | 200810746 A | 1/2008 |
| JP | WO2008/065918 * | 6/2008 |
| JP | 2009049443 A | 3/2009 |
| JP | 2009515336 A | 4/2009 |
| WO | WO2007/117153 * | 10/2007 |
| WO | 2008/065918 A1 | 6/2008 |
| WO | 2008115814 A2 | 9/2008 |

OTHER PUBLICATIONS

Kessels W. et al., "Electric Field Induced Surface Passivation of Si by Atomic Layer Deposited Al2O3 Studied by Optical Second-Harmonic Generation", Photo-voltaic Specialists Conference, 2009.

International Search Report and Written Opinion for corresponding International Application No. PCT/DE2010/075045, completed on Oct. 5, 2010, and mailed on Oct. 14, 2010.

Hoffman et al., "Recent Developments in Rear-Surface Passivation at Fraunhofer ISE", Solar Energy Materials & Solar Cells 93 (2009) 1074-1078.

International Search Report for corresponding International Application No. PCT/JP2007/072343, dated Dec. 6, 2007, and mailed on Dec. 18, 2007.

* cited by examiner a)

b)

c)

d)

e)

SEMICONDUCTOR APPARATUS AND METHOD OF FABRICATION FOR A SEMICONDUCTOR APPARATUS

CROSS REFERENCE TO RELATED APPLICATIONS

This application is a national stage of PCT International Application No. PCT/DE2010/075045, filed on May 31, 2010, and published in German on Dec. 23, 2010, as WO 2010/145648 A1, and claims priority to German Application No. 102009025977.5 filed on Jun. 16, 2009, the entire disclosures of which are incorporated herein by reference.

The invention relates to a semiconductor apparatus and a method of fabrication for a semiconductor apparatus.

One of the limiting factors for solar cell efficiency is the recombination of charge carriers at semiconductor surfaces of solar cells which have surface states promoting the recombination activity. These recombined charge carriers are then no longer available for generating current. In order to reduce recombinations, the solar cell surface has to be passivated by reducing the recombination activity of charge carriers by way of surface states.

For surface passivation there are two different approaches in principle, since the recombination activity scales firstly with the number or density of the surface states and secondly with the charge carrier density, more precisely with the product of hole and electron density. Consequently, for surface passivation it is possible firstly to reduce the number of surface states. This so-called chemical passivation is achieved by means of chemical saturation of free surface bonds (so-called dangling bonds), in the case of silicon semiconductor solar cells for example by means of thermal growth of a silicon oxide layer ($SiO_2$ layer). The interface that arises in this case between the semiconductor and the $SiO_2$ layer is distinguished by a particularly low density of said surface states. Chemical passivation is generally used for the surface passivation of high-efficiency solar cells.

The second approach for surface passivation consists in one of the charge carrier types (namely the positive or the negative charge carriers) being kept away from the recombination-active states at the semiconductor surface by a suitable potential being applied there. In this way, not enough recombination partners are available to the respective other charge carrier types. This so-called field-effect passivation is the basic principle for example in the case of the so-called back surface field (BSF) composed of aluminum and in the case of applying dielectric layers, for example composed of silicon nitride ($SiN_x$) or aluminum oxide ($Al_2O_3$), which form stationary surface charges at their interfaces with the semiconductor surface.

Both of the abovementioned approaches for surface passivation have the disadvantage that in general they do not obtain sufficient passivation by themselves. By way of example, an $SiO_2$ layer produced by means of thermal oxidation on a silicon surface has to be additionally enriched by hydrogen, for example by means of so-called forming gas anneal or alneal. Further, after surface passivation, solar cells have to undergo still further method steps during fabrication. Firstly, therefore, the surface passivation has to remain stable during these method steps. Secondly, the passivation layer applied for this purpose generally also has to have additional functionalities, such as acting as a diffusion barrier, for example. This additional requirement made of the passivation layer often leads to a compromise solution with sub-optimum surface passivation.

Therefore, it is an object of the invention to provide a semiconductor apparatus and a method of fabrication for a semiconductor apparatus in order to effectively passivate the surface of the semiconductor apparatus and at the same time to increase the design diversity for the optimization of further process steps during the fabrication of the semiconductor apparatus.

The object is achieved according to the invention by means of a semiconductor apparatus comprising the features of claim 1 and by means of a method of fabrication comprising the features of claim 15. Advantageous developments of the invention are presented in the dependent claims.

Even though reference is made hereinafter principally to solar cells and the passivation layer according to the invention has great economic importance particularly for solar cells, the same or at least corresponding considerations also apply to other semiconductor apparatuses in which a good surface passivation is of importance.

As explained below, the passivation quality and the stability of the passivation layer can be improved by means of the invention. Moreover, a higher flexibility can arise with regard to the adjustable method parameters. The invention is based on the insight that forming a passivation layer made from two passivation sublayers with different passivation mechanisms can lead to an improvement in the passivation quality which goes beyond a mere accumulation of the known individual effects.

The designation of chemically passivating passivation sublayer and field-effect-passivating passivation sublayer is taken to mean that the respective passivation mechanism is dominant in the associated passivation sublayer. In other words, the field-effect-passivating passivation sublayer can, if it is arranged directly on a semiconductor layer surface, perfectly well have a chemically passivating effect, as is the case for example for silicon nitride ($SiN_x$) on silicon. However, the field-effect-passivating effect is much greater. The same applies to the chemically passivating passivation sublayer which can have an, albeit low, surface charge density, but the chemically passivating effect is dominant.

Advantageously, the field-effect-passivating passivation sublayer has at least a higher surface charge density than the chemically passivating passivation sublayer. Preferably, the surface charge density of the field-effect-passivating passivation sublayer is at least approximately one order of magnitude higher than the surface charge density of the chemically passivating passivation sublayer.

In particular, the chemically passivating passivation sublayer and/or the field-effect-passivating passivation sublayer are/is formed in each case from a dielectric material.

It should be pointed out at this juncture that the effect of a field-effect passivation is dependent not only on the surface charge density of a field-effect-passivating passivation sublayer, but also on the charge carrier density and thus on the doping density and doping type of the semiconductor layer whose surface is to be passivated. Similarly, the effect of a chemical passivation, too, is dependent not only on the material of the chemically passivating passivation sublayer but also partly to a considerable extent on the surface properties of the semiconductor surface to be passivated, in particular on its defect density. The latter can depend, moreover, on the manner of applying the passivation sublayers. By way of example, the chemically passivating passivation sublayer can be deposited, for instance by means of wet-chemical methods or by means of deposition from the gas phase, or it can be grown thermally.

In the present case, therefore, two different passivation effects are used for the surface passivation, which, however, are divided between different passivation sublayers and are thus decoupled from one another. In addition to a more effective passivation, the passivation layer formed at least from a chemically passivating and a field-effect-passivating passivation sublayer has the advantage of having a higher stability than just a passivation layer of one type of passivation. In general, during their fabrication, solar cells undergo a series of further process steps after the surface passivation has been applied. In this case, the surface passivation can lose passivation quality. With a combination of the two passivation sublayers, this loss of passivation quality can be reduced or completely prevented. By way of example, by means of the two-layered passivation, an increased firing stability can be achieved, for example for the firing process in the context of a screen printing method.

A further advantage arises from the following consideration: some chemically passivating passivation sublayers passivate the semiconductor layer surface principally by means of saturation of so-called dangling bonds. This is the case for example for thermally grown $SiO_2$ layers on silicon. For $SiO_2$ layers, in particular, it is known that an additional process step is necessary in order to provide the interface between the semiconductor and the passivation sublayer with additional hydrogen in order to obtain a sufficiently good surface passivation. One typical process step for this purpose is, for example, the so-called forming gas anneal or alneal, wherein aluminum reacts with $SiO_2$ at elevated temperature and hydrogen is liberated.

Problems can arise in this case, for example on account of the volatility of hydrogen, or by virtue of the fact that an alneal cannot be realized at all, which might be the case for example for standard metallizations by means of screen printing pastes. In the case of the solar cell described here, by contrast, not just exclusively the chemical passivation of one of the same layer is improved, rather the passivation quality is increased with the aid of an additional field-effect-passivating passivation sublayer. It is advantageous, moreover, if an additional hydrogen passivation of the interface between semiconductor layer surface and passivation layer is effected by the application or by the deposition of the field-effect-passivating passivation sublayer. This occurs, for example, if an $SiN_x$ layer is applied on a chemically passivating $SiO_2$ layer.

During the fabrication of the solar cell, advantageously, firstly the chemically passivating passivation sublayer is directly applied to the semiconductor layer surface and, afterward, the field-effect-passivating passivation sublayer is deposited directly onto the chemically passivating passivation sublayer. Alternatively, it can turn off or the growth can take place in the wide layers at different stages of the fabrication process. Moreover, it is advantageous, after the fabrication of the passivation layer to subject the latter to a thermal treatment (heat treatment step).

In accordance with one expedient configuration it is provided that the chemically passivating passivation sublayer is arranged between the semiconductor layer and the field-effect-passivating passivation sublayer on the semiconductor layer surface. In other words, during the fabrication of the solar cell, the field-effect-passivating passivation sublayer is applied after the chemically passivating passivation sublayer has been applied, wherein further process steps can be effected therebetween. When the solar cell is used, the field-effect-passivating passivation sublayer can in this case influence the semiconductor layer surface through the chemically passivating passivation sublayer and repel charge carriers there into the semiconductor.

In one advantageous configuration of the method of fabrication it is provided that before the field-effect-passivating passivation sublayer is applied, the chemically passivating passivation sublayer applied is used as a diffusion barrier in a diffusion process, as an etching barrier in an etching process and/or as a texture barrier in a texture process. If the passivation layer is a rear-side passivation, for example, then the chemically passivating passivation sublayer can act as a diffusion barrier during the application of a rear-side dielectric layer.

Alongside the functions mentioned here, the chemically passivating passivation sublayer can, if appropriate, fulfill further functional tasks during the solar cell fabrication process, in order, for example, to save costs and to reduce complexity for otherwise required functionally specific intermediate layers or sacrificial layers. The above-explained decoupled application of the two passivation mechanisms of field-effect and chemical passivation with the aid of two passivation sublayers allows a greater selection of parameters by virtue of the fact that the chemically passivating passivation sublayer entails properties which foster said additional functionalities in the solar cell fabrication process, while the further, field-effect-passivating passivation sublayer increases the surface passivation by means of forming a field effect.

In one preferred embodiment it is provided that the chemically passivating passivation sublayer directly adjoins the field-effect-passivating passivation sublayer. In this case, therefore, the field-effect-passivating passivation sublayer is applied after the chemically passivating passivation sublayer has been applied, without further intermediate layers being arranged therebetween. It is nevertheless conceivable for further process steps to be performed on the solar cell, or on the chemically passivating passivation sublayer for example a cleaning step, before the field-effect-passivating passivation sublayer is applied.

In one advantageous development it is provided that an intermediate layer is arranged between the chemically passivating passivation sublayer and the field-effect-passivating passivation sublayer. The intermediate layer can serve for influencing or optimizing electrical, optical and/or mechanical properties of the passivation layer or the connection between the two passivation sublayers. By way of example, between a chemically passivating passivation sublayer composed of $SiO_2$ and a field-effect-passivating passivation sublayer composed of $Al_2O_3$, it is possible to produce an $SiO_x$ intermediate layer that is less expensive than both of said sublayers, in order to influence the reflection properties of the passivation layer.

Cumulatively or alternatively thereto, provision can also be made for providing on the field-effect-passivating passivation sublayer a further layer for adapting or modifying the passivation layer that progressively a silicon nitride layer for antireflective coating (antireflection layer—ARC).

It is preferably provided that at least one of the passivation sublayers is formed in a manner free of pinholes. This is advantageous particularly in the case of overlapping metallizations in a plurality of metallization planes in the case of solar cells that make contact at the rear side, in order to reduce the risk of short circuits. Although it may be sufficient if only one of the passivation sublayers is free of pinholes, this advantageously applies both to the chemically passivating passivation sublayer and to the field-effect-passivating passivation sublayer.

In one expedient embodiment it is provided that the field-effect-passivating passivation sublayer is formed by means of atomic layer deposition (ALD for short) preferably thermal ALD, by means of physical or chemical vapor deposition (PVD or CVD), if appropriate plasma-enhanced (PECVD), or by means of sol-gel methods. With ALD, particularly uniform and complete layers can be formed from aluminum oxide, in particular. In addition, the layer thickness can be set very accurately, in the ideal case accurately to one atomic layer. Both for applying the chemically passivating passivation sublayer and for applying the field-effect-passivating passivation sublayer, however, further known methods can be used independently of one another, for example chemical or physical deposition methods. However, the quality of the chemically passivating passivation sublayer is not critical to the same extent as that of the field-effect-passivating passivation sublayer, such that the former can be produced by means of less expensive methods such as CVD, wet-chemical oxidation, PVD (for example sputtering or vapor deposition).

In one advantageous configuration it is provided that the field-effect-passivating passivation sublayer has a thickness in a range of between 0.1 and 10 nm, preferably between 2 and 5 nm. Thicker layers of up to 100 nm or more are also conceivable. This is occasionally dependent on the costs of the deposition method, which, by way of example, are significantly higher in the case of ALD than in the case of other methods, as is possible in the case of plasma-enhanced chemical vapor deposition (PECVD). In one preferred embodiment, the thickness of the field-effect-passivating passivation sublayer is between approximately 10 and approximately 15 nm.

In accordance with one preferred development it is provided that that the passivation layer is embodied as a reflection layer or as an antireflection layer. While an additional function of the passivation layer as a reflection layer, more particularly for infrared light, on the solar cell rear side facing away from the incident light is advantageous, a passivation layer embodied as an antireflection layer on the solar cell front side is desirable. In order to embody the passivation layer as a reflection layer or as an antireflection layer, the layer thicknesses and/or the optical properties of the two passivation sublayers can be chosen independently of one another.

It is advantageously provided that the field-effect-passivating material or the field-effect-passivating passivation sublayer is substantially formed from a material having a surface charge density of at least $10^{12}$ cm$^{-2}$, preferably of at least $5 \times 10^{12}$ cm$^{-2}$, preferably of at least $10^{13}$ cm$^{-2}$. This can be a positive or a negative surface charge density.

In one advantageous configuration it is provided that the field-effect-passivating passivation sublayer is substantially formed from a material having a negative surface charge density. A series of materials suitable for fabricating primarily chemically passivating passivation layers have low positive surface charge densities. This holds true for example when using silicon semiconductors for amorphous silicon layers (a-Si layers) and $SiO_2$ layers. Thus, by way of example, a thermally grown $SiO_2$ layer has a typical surface charge density of approximately $10^{11}$ cm$^{-2}$. This positive surface charge density can have a disadvantageous effect in the case of p-doped semiconductor layers. By way of example, the quality of a passivation by means of an $SiO_2$ layer can be dependent on the injection density of photogenerated excess charge carriers, which can in turn have a negative influence on the efficiency of the solar cell.

By means of the additional field-effect-passivating passivation sublayer having a negative surface charge density, the effect of the much lower positive surface charge density of the underlying passivation sublayer can be reduced or even reversed by virtue of the effective surface charge density of the entire passivation layer being quantitatively changed and/or even its polarity being reversed. To put it more generally, such an effect can be utilized when the much greater surface charge density of the field-effect-passivating passivation sublayer has a different sign than a possibly present surface charge density of the chemically passivating passivation sublayer.

From the effect of the surface charge density of the field-effect-passivating passivation sublayer, a further significant advantage arises depending on the polarity of the semiconductor layer acting as a base and the surface charge density of the passivation sublayers: in the case of chemically passivating layers having a low positive surface charge density which are applied to a p-doped or p-type semiconductor layer, it is possible, depending on the ratio between semiconductor doping and surface charge density, for an inversion layer to form on the semiconductor surface. A corresponding situation prevails in the case of an n-doped or n-type semiconductor layer on which a chemically passivating layer having a negative surface charge density is arranged. In the case of solar cells connected by means of point contacts, an inversion channel forms between the point contacts, said inversion channel representing a known source of charge carrier and hence efficiency losses. This problem can be avoided by, as proposed here, applying a field-effect-passivating passivation sublayer to the chemically passivating layer. For this purpose, for example when using a p-type semiconductor layer, it is possible to use a field-effect-passivating passivation sublayer having a high negative surface charge density, for example an $Al_2O_3$ layer.

In accordance with one preferred configuration it is provided that the field-effect-passivating passivation sublayer comprises aluminum oxide, aluminum fluoride, silicon nitride, aluminum oxynitride and/or some other compound composed of aluminum oxide or aluminum oxynitride ($Al_xO_yN_z$) and one or more further elements. Aluminum oxide ($AlO_x$ or $Al_2O_3$) and aluminum fluoride ($AlF_3$) are materials which form a field-effect-passivating passivation sublayer having a negative surface charge density, while a passivation sublayer composed of silicon nitride has a positive surface charge density. The further elements can be, for example, metals, more particularly rare earth metals, or carbon.

It is preferably provided that the chemically passivating passivation sublayer comprises an amorphous semiconductor material or a semiconductor oxide. By way of example, this can be a layer composed of amorphous silicon or an $SiO_2$ layer that are suitable for a chemical passivation of silicon semiconductor layers. A semiconductor oxide can be produced on the semiconductor layer either by means of a deposition method or by means of oxidation of the semiconductor layer surface.

Advantageously, the chemically passivating passivation sublayer is formed from a compound composed of silicon with oxygen, nitrogen and/or carbon. In particular, silicon oxynitrides ($SiO_xN_y$) or silicon oxynitride-carbides ($SiO_xN_yC_z$) are suitable as material for the chemically passivating passivation sublayer. Through suitable selection of the materials for the passivation sublayers, it is possible to produce passivation layers which perform functional tasks during solar cell fabrication, for example serve as etching, texture and/or diffusion barriers. Alternatively or additionally, the chemically passivating passivation sublayer alone can also perform such a function in the process flow. In one expedient development it is provided that the passivation layer extends over substantially the entire semiconductor surface. In this case, however, perforations or passages for the interconnection of the solar cell can be formed in the passivation layer. Moreover, edge regions of the solar cell can be exposed out of technical necessity.

Expediently, a passivation on both sides by means of the passivation layer is provided. The passivation layers can have the same features and properties on the solar cell front side and on the solar cell rear side. Alternatively, they can also be embodied differently in a manner adapted to the respective needs. In particular, when forming the passivation layer with additional optical properties, it is expedient to fashion the front-side passivation layer as an antireflection layer and/or the rear-side passivation layer as a reflection layer for the relevant light spectrum.

In accordance with one preferred embodiment, the passivation layer overall has at the semiconductor layer surface an interface charge density of at most $10^{13}$ cm$^{-2}$, at most $10^{12}$ cm$^{-2}$ or at most $10^{11}$ cm$^{-2}$. In particular, interface charge densities of approximately $5 \times 10^{11}$ cm$^{-2}$ for the passivation both of n-type and of p-type semiconductor layers have proved to be advantageous.

It should therefore be pointed out that the high surface charge density of the field-effect-passivating passivation sublayer is not necessarily directly reflected in the surface charge density values of the passivation layer. On account of the combination of the field-effect-passivating passivation sublayer with the chemically passivating passivation sublayer, therefore, a passivation layer having very high passivation quality can arise which overall has a rather low surface charge density. Such a passivation layer is suitable both on n-type and on p-type semiconductor layers, without forming an inversion channel.

The maximum interface charge density of the entire passivation layer that can be afforded tolerance may be dependent on the material and on the doping of the semiconductor layer near the semiconductor layer surface. The preferred maximum values specified above relate to semiconductor layers having a doped Si surface area (surface concentration of approximately $1 \times 10^{19}$ to $6 \times 10^{20}$ cm$^{-2}$).

In accordance with one expedient embodiment, the chemically passivating passivation sublayer has a layer thickness of at least 1 nm, 5 nm, 10 nm, 50 nm or 100 nm. The thicker the chemically passivating passivation sublayer, the more distant the field-effect-passivating passivation sublayer is from the semiconductor layer surface, such that the interface charge density turns out to be lower. At least in the case of wet-chemical deposition of the chemically passivating passivation sublayer, a layer thickness of approximately 1 to 5 nm can also be advantageous.

In the expedient embodiments, the chemically passivating passivation sublayer and/or the field-effect-passivating passivation sublayer are/is applied as a low-temperature layer. In particular, both layers are applied at a temperature of less than 400° C.

Figure 2:
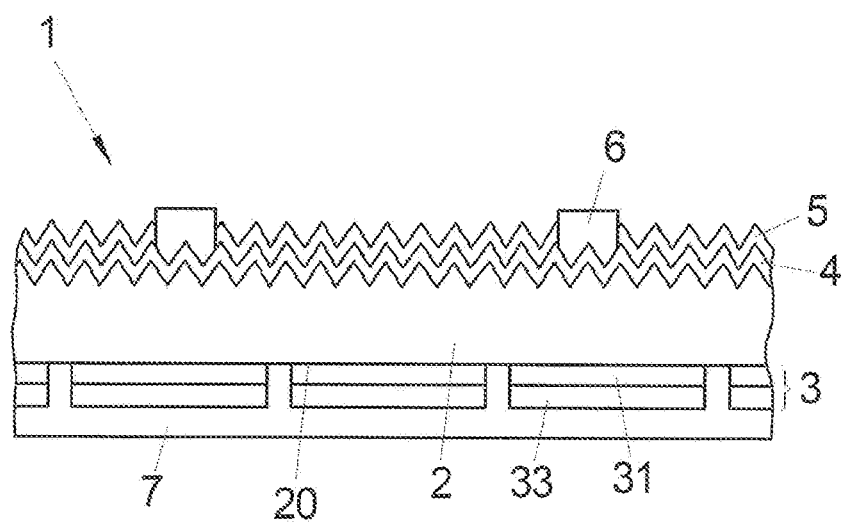

The invention is explained below on the basis of exemplary embodiments with reference to the figures, in which:

FIGS. 1a to 1e show schematic cross-sectional views of a solar cell in different stages of a method of fabrication in accordance with one preferred embodiment; and FIG. 2 shows a schematic cross-sectional view of a solar cell that was fabricated by means of the method illustrated in FIGS. 1a to 1e.

The fabrication of a solar cell 1 with surface passivation on both sides in accordance with one possible embodiment is described below with reference to FIGS. 1a to 1e. As explained in the introductory part of the description, these considerations likewise apply to other semiconductor apparatuses alongside solar cells. FIG. 1a shows a cross section through a semiconductor layer 2, having a semiconductor layer surface 20, which here forms a light-remote solar cell rear side 20, and a further semiconductor layer surface 22, which here forms a light-facing solar cell front side 22. The semiconductor layer surface 20 is preferably textured in order to increase the efficiency, which is illustrated as sawtooth patterning in the figures.

A chemically passivating passivation sublayer 31 is applied on the semiconductor layer surface 20 in accordance with FIG. 1b, which sublayer can furthermore serve as a diffusion barrier in a subsequent doping step for doping the further semiconductor layer surface 22. After the doping step, the arrangement from FIG. 1c is obtained, wherein the further semiconductor layer surface 22 is provided with a doping layer 4 that forms a pn junction with the rest of the semiconductor layer 2. The further semiconductor layer surface 22 is subsequently passivated by means of a further passivation layer 5, applied to the doping layer 4 in accordance with FIG. 1d.

A field-effect-passivating passivation sublayer 33 is thereupon applied on the chemically passivating passivation sublayer 31. This gives rise to the passivation layer 3 illustrated in FIG. 1e on the semiconductor layer surface 20, which forms the rear-side solar cell surface. For this reason, it is advantageous to produce a passivation layer 3 by means of suitable selection of the physical properties and the deposition parameters of the passivation sublayers 31, 33, which passivation layer simultaneously serves as a rear-side reflection layer for the light spectrum relevant to the respective solar cell. For this purpose, in contrast to the illustration shown in FIG. 1e, an additional intermediate layer can be arranged between the passivation sublayers 31, 33.

The further passivation layer 5 can be a conventional passivation layer formed by means of an individual chemically passivating or field-effect-passivating layer. Alternatively, the further passivation layer 5 can also be composed of a combination of two passivation sublayers in accordance with the passivation layer 3.

In order to enable the solar cell 1 to be interconnected, it is necessary, finally, to fabricate accesses respectively to the semiconductor layer 2 and the doping layer 4 and to metalize the solar cell 1 on the rear side and on the front side, for example by means of screen printing methods with a subsequent firing process. For this purpose, perforations are produced in the passivation layer 3 and the further passivation layer 5. As a result, the solar cell 1 in accordance with FIG. 2 is obtained after the metallization steps. On the solar cell rear side 20, the metallization can be effected over the whole area, in order to produce a rear-side contact 7, while on the solar cell front side 22 it forms front-side contacts 6, which are preferably embodied in a finger-shaped fashion.

The semiconductor layer 2 can be, for example, a layer composed of crystalline silicon in the form of a silicon wafer, wherein, in this case, the chemically passivating passivation sublayer 31 can be formed from $SiO_2$ grown thermally or produced by means of PECVD, or from amorphous silicon (a-Si). The field-effect-passivating passivation sublayer 33 is formed from $Al_2O_3$, for example.

The deposition or the growth of the two passivation sublayers 31, 33 can take place at different stages of the fabrication process. It is thereby possible to utilize functionalities of the chemically passivating passivation sublayer 31 in the fabrication process. What is crucial and not obvious in this case is that surface charges of the field-effect-passivating passivation sublayer 33 also form during deposition onto the chemically passivating passivation sublayer 31, which is a dielectric. This is the case particularly for the $Al_2O_3$ layer on the $SiO_2$ layer. Since the best results for $Al_2O_3$ passivation layers are currently obtained by means of ALD, ALD is the preferred deposition method.

However, it is perfectly possible to use other deposition methods, too, for example PECVD, particularly if, in the present fabrication method with the two passivation sublayers, they yield results that are similarly as good as those of ALD. For cost reasons, deposition by means of PECVD is then even preferable.

In addition, this layer combination composed of the two passivation sublayers 31, 33 affords significant advantages for industrial application. Most of the fabrication methods currently in laboratory development for high-efficiency solar cells use a thermally produced $SiO_2$ layer, but transferring this fabrication method to solar cells fabricated industrially by means of screen printing proves to be difficult. This is firstly owing to the low stability of the $SiO_2$ layer with respect to firing processes that are necessary during screen printing, and secondly owing to the fact that hydrogen is required for a very good passivation in the $SiO_2$ layer. In the case of solar cells produced in the laboratory, an aluminum layer applied by means of physical vapor deposition (PVD) acts as a hydrogen donor. In industrial fabrication, however, screen printing has major complexity and cost advantages over PVD methods.

On account of the combination of two passivation effects, the density of the surface states is no longer solely critical for the passivation quality. The layer therefore still passivates sufficiently after the firing process, despite an increased number of surface states. Since, moreover, the in any case very good passivation quality of the thermally grown $SiO_2$ layer is increased even further by means of the $Al_2O_3$ layer being applied, this arrangement is also of interest for those high-efficiency solar cells which are not subjected to a firing process during fabrication.

A further important advantage for any type of combination of chemically passivating passivation sublayer 31 and field-effect-passivating passivation sublayer 33 to form a passivation layer 3 is the less stringent requirement made of the quality of the chemical passivation, particularly in the case of thermally grown semiconductor oxides. This results from the fact that the number of surface states is no longer solely crucial for the passivation quality. Therefore, for a very good passivation, dry-grown oxides are no longer required and even oxide layers produced by means of PECVD are gaining in importance. The advantage here is that a high-temperature step of thermal oxidation is replaced by a low-temperature step of PECVD deposition, which, inter alia, makes less stringent demands on the material of the solar cell 1.

Finally, flexibility in the fabrication process is obtained by means of the passivation sublayers 31, having different effects. By way of example, the passivation sublayers 31, 33 can be formed at different points in the fabrication process and, if appropriate, perform additional functions; by way of example, the $SiO_2$ layer can act as a diffusion barrier, for example for phosphorus diffusion.

The solar cells 1 in the embodiments illustrated here in each case have a two-ply passivation layer 3 only on one side. Alternatively, the passivation layer 3 composed of the chemically passivating passivation sublayer 31, for example composed of wet-chemically or thermally grown silicon oxide, and the field-effect-passivating passivation sublayer 33, for example composed of aluminum oxide, can be applied on both semiconductor layer surfaces 20, 22. To put it another way, the further passivation layer 5 can likewise be a two-ply passivation layer 3. A covering layer, for example composed of silicon nitride ($SiN_x$), possibly applied on the passivation layer 3 can likewise bear on both sides of the solar cell.

REFERENCE NUMERALS 1 semiconductor apparatus (solar cell)
2 semiconductor layer
20 semiconductor layer surface, solar cell rear side
22 further semiconductor layer surface, solar cell front side
3 passivation layer
31 chemically passivating passivation sublayer
33 field-effect-passivating passivation sublayer
4 doping layer
5 further passivation layer
6 front-side contact
7 rear-side contact

The invention claimed is:

1. A semiconductor apparatus comprising:
a semiconductor layer in the form of a wafer and a passivation layer arranged on a surface of the semiconductor layer and serving for passivating the semiconductor layer surface, wherein the passivation layer comprises a chemically passivating passivation sublayer and a field-effect-passivating passivation sublayer, which are arranged one above the other on the semiconductor layer surface;
wherein the chemically passivating passivation sublayer directly adjoins the field-effect-passivating passivation sublayer without further intermediate layers being arranged therebetween and wherein:
i) the field-effect-passivating passivation sublayer is substantially formed from a material having a negative surface charge density; and
ii) a covering layer comprising silicon nitride applied on the passivation layer.

2. The semiconductor apparatus as claimed in claim 1, wherein the chemically passivating passivation sublayer is arranged between the semiconductor layer and the field-effect-passivating passivation sublayer on the semiconductor layer surface.

3. The semiconductor apparatus as claimed in claim 1, wherein one of the passivation sublayers is formed in a manner free of pinholes.

4. The semiconductor apparatus as claimed in claim 1, wherein the field-effect-passivating passivation sublayer is a layer deposited by atomic layer deposition, a layer deposited by CVD, a layer deposited by PECVD, a layer deposited by PVD or a sol-gel layer.

5. The semiconductor apparatus as claimed in claim 1, wherein the field-effect-passivating passivation sublayer has a thickness in a range of between 0.1 and 10 nm.

6. The semiconductor apparatus as claimed in claim 1, wherein the passivation layer is embodied as a reflection layer or as an antireflection layer.

7. The semiconductor apparatus as claimed in claim 1, wherein the field-effect-passivating material or the field-effect-passivating passivation sublayer is substantially formed from a material having a surface charge density of at least $10^{12}$ cm$^{-2}$.

8. The semiconductor apparatus as claimed in claim 1, wherein the chemically passivating passivation sublayer comprises an amorphous semiconductor material or a semiconductor oxide.

9. The semiconductor apparatus as claimed in claim 1, wherein the chemically passivating passivation sublayer is formed from a compound consisting of silicon with oxygen, nitrogen and/or carbon.

10. The semiconductor apparatus as claimed in claim 1, wherein the passivation layer extends over substantially the entire semiconductor layer surface.

11. The semiconductor apparatus as claimed in claim 1, further comprising a passivation on both sides of the semiconductor layer by means of the passivation layer.

12. The semiconductor apparatus as claimed in claim 1, wherein the passivation layer has at the semiconductor layer surface an interface charge density of at most $10^{13}$ cm$^{-2}$.

13. The semiconductor apparatus as claimed in claim 1, wherein the chemically passivating passivation sublayer (31) has a layer thickness of at least 1 nm, 5 nm, 10 nm, 50 nm or 100 nm.

14. The semiconductor apparatus as claimed in claim 1, wherein the chemically passivating passivation sublayer and/or the field-effect-passivating passivation sublayer are/is applied as a low-temperature layer.

15. A method of fabrication for a semiconductor apparatus, wherein a semiconductor layer in the form of a wafer is provided, having a semiconductor layer surface, and wherein a chemically passivating passivation sublayer and a field-effect-passivating passivation sublayer are applied successively on the semiconductor layer surface in order jointly to form a passivation layer, wherein the chemically passivating passivation sublayer and the field-effect-passivating passivation sublayer are applied such that chemically passivating passivation sublayer directly adjoins the field-effect-passivating passivation sublayer without further intermediate layers being arranged therebetween and wherein:

i) the field-effect-passivating passivation sublayer is substantially formed from a material having a negative surface charge density; and ii) a covering layer comprising silicon nitride is applied on the passivation layer.

16. The method of fabrication as claimed in claim 15, wherein the field-effect-passivating passivation sublayer is applied after the chemically passivating passivation sublayer has been applied.

17. The method of fabrication as claimed in claim 16, wherein before the field-effect-passivating passivation sublayer is applied, the chemically passivating passivation sublayer applied is used as a diffusion barrier in a diffusion process, as an etching barrier in an etching process and/or as a texture barrier in a texture process.

18. The method of fabrication as claimed in claim 15 wherein the chemically passivating passivation sublayer and the field-effect-passivating passivation sublayer are applied in such a way that the passivation layer resulting therefrom acts as a reflection layer or as an antireflection layer.

* * * * *